United States Patent [19]

Reime

[11] Patent Number: 5,789,738
[45] Date of Patent: Aug. 4, 1998

[54] CIRCUIT FOR SETTING THE OPERATING POINT OF AN OPTO-ELECTRONIC COMPONENT

[76] Inventor: Gerd Reime, 88, Friedenstrasse, D-75328 Schömberg, Germany

[21] Appl. No.: 793,636

[22] PCT Filed: Aug. 25, 1995

[86] PCT No.: PCT/DE95/01150

§ 371 Date: Feb. 25, 1997

§ 102(e) Date: Feb. 25, 1997

[87] PCT Pub. No.: WO96/07084

PCT Pub. Date: Mar. 7, 1996

[30] Foreign Application Priority Data

Sep. 1, 1994 [DE] Germany ............ 44 31 117.6

[51] Int. Cl.[6] ............................................. H01J 40/14
[52] U.S. Cl. ........................ 250/214 R; 250/214 L; 356/226
[58] Field of Search ..................... 250/214 R, 214.1, 250/551, 208.1, 214 L; 356/226, 221, 223, 227; 257/536, 546; 327/514, 520, 589

[56] References Cited

U.S. PATENT DOCUMENTS 5,578,815  11/1996  Nakase et al. ............... 250/214 R

FOREIGN PATENT DOCUMENTS

| | | |
|---|---|---|
| 3233728A1 | 3/1984 | Germany . |
| 3233729C2 | 2/1987 | Germany . |
| 3543677A1 | 6/1987 | Germany . |
| 3619497A1 | 12/1987 | Germany . |
| 3620931A1 | 1/1988 | Germany . |
| 3743765A1 | 7/1989 | Germany . |
| 3743766A1 | 7/1989 | Germany . |
| 3803034A1 | 8/1989 | Germany . |
| 3930415C1 | 3/1991 | Germany . |
| 9309837.5 | 10/1993 | Germany . |

*Primary Examiner*—Que Le
*Attorney, Agent, or Firm*—Spencer & Frank

[57] ABSTRACT

A circuit is provided for adjusting an operating point of an opto-electronic element having a saturation voltage and which constitutes a component of a receiver for alternating light useful signals and which generates current during a short-circuit operation and voltage during a no-load operation. The circuit comprises a resistive circuit connected in parallel with the opto-electronic element for adjusting the operating point of the opto-electronic element below the saturation voltage for the compensation of constant light signals. The resistive circuit includes an automatic control resistor which changes its resistance as a function of voltage when a specific voltage below the saturation voltage is exceeded for loading the opto-electronic element until the specific voltage is essentially reached.

12 Claims, 3 Drawing Sheets

CIRCUIT FOR SETTING THE OPERATING POINT OF AN OPTO-ELECTRONIC COMPONENT

FIELD OF INVENTION

The invention concerns a circuit for setting an operating point of at least one opto-electronic element, which generates current during a short-circuit operation and voltage during a no-load operation, wherein the opto-electronic element constitutes a component of a receiver for alternating light useful signals and the circuit adjusts the operating point below the saturation voltage of the opto-electronic element with a resistive circuit connect parallel to the opto-electronic element, at least for the compensation of constant light signals.

PRIOR ART

A circuit of this type is known, for example, from DE-C 39 30 415 and is used to measure changes in light incidence and to obtain usable signals from this. Since there is, in principle, a logarithmic connection between the intensity of illumination and the no-load voltage of a photodiode, a saturation voltage is quickly reached with increasing illumination, which is reached at approximately 0.5 V, depending on the photodiode used. Above the saturation voltage, there is a linear relationship between illumination intensity and photoelectric current over many powers of ten. If the intent is to convert alternating light useful signals, superimposed by constant light, into a signal voltage, it is necessary that the photodiode be operated in a range below this saturation voltage in order to be able, at all, to detect a signal pattern and thus set the operating point.

In DE-C 39 30 415, a compensation voltage is generated for this purpose by means of a second photodiode without requiring current from the supply voltage. The voltage from the second photodiode is supplied to the actual photodiode as a counter, or external voltage via a coil with constant internal resistance. As a result of this, two photodiodes are initially necessary, of which only one actively receives the alternating light. However, for a compensation of the photoelectric voltage with the same type of voltage generated by the second photodiode, both diodes must be illuminated evenly, which is not always ensured. In order to solve this problem, it is suggested that the interference signal photodiode is designed larger than the useful signal photodiode, which results in higher costs for the circuit. In this case, the voltage is varied while the resistance remains the same. The use of a coil in the direct current path additionally has the disadvantage that this circuit cannot be integrated into an IC (integrated circuit). In addition, this integration is made even more difficult in that it is not possible to switch to a symmetric input because of the capacitor, which is parallel-connected to the interference signal photosensor.

In order to hold the photodiode below the saturation voltage, it is also known to operate the photodiode during the diode operation with bias voltage. For this purpose, a bias voltage is fed to the diode in order to block it (opposite polarization to the saturation voltage). Alternatively, the diode can also be operated by a cell without bias voltage. In that case, the photodiode functions as a current source. For this purpose, the photodiode is kept at a zero potential wile the photoelectric current is compensated via a resistor.

Both types of operation, meaning diode or cell operation, have in common that they need an external power source in order to compensate for the photoelectric current that appears during illumination. Depending on the type of diode and illumination, this compensation current can amount to several umpteen µA to several mA. This current must be taken from the supply voltage, which can lead, in the case of battery operation, to a quick failure of the battery. This current, which must be supplied by the battery, can possibly amount to a multiple of the current taken up by the complete circuit.

The invention is suited in a preferred way for use in connection with a battery-operated water sensor, such as is known from DE-U 93 09 837.5. Operating a water sensor with a battery is desirable, for example, in the field of boat construction. Boats of "leisure time captains" as a rule have one or several sleeping berths in the bow, below the sliding window on the side. Frequently, someone neglects to close these, so that spraying water wets the sleeping berths without the boat coxswain noticing it. If in this case the window surfaces are checked at regular intervals for spraying water with the known water sensors, then these can be closed, if necessary automatically. Another area of use would be, for example, a water sensor attached to the clothes line of a housewife, which sounds a signal when rain drops appear. Here too it is necessary to check for water drops that appear. Such devices therefore basically do not depend on an external current supply, but if they are operated with a 9 V unit, the average power consumption must be kept low. They can generally be used wherever alternating light wanted signals are detected.

SUMMARY OF THE INVENTION

Starting with this Prior Art, it is therefore an object of the invention at hand to generate the compensation current needed due to the constant light current without external voltage, so that almost no current must be supplied by the power supply or battery.

The above and other objects are accomplished according to the invention by the provision of a circuit for adjusting an operating point of an opto-electronic element having a saturation voltage and which constitutes a component of a receiver for alternating light useful signals and which generates current during a short-circuit operation and voltage during a no-load operation, the circuit comprising a resistive circuit connected in parallel with the opto-electronic element for adjusting the operating point of the opto-electronic element below the saturation voltage for the compensation of constant light signals, the resistive circuit including an automatic control resistor which changes its resistance as a function of voltage when a specific voltage below the saturation voltage is exceeded for loading the opto-electronic element until the specific voltage is essentially reached.

With opto-electronic elements for receiving light signals, regardless of whether photodiodes, light diodes or phototransistors are used, the voltage in this case also increases logarithmically with the illumination intensity until the saturation voltage is reached at, for example, 0.5 V. In the saturation voltage range, a further increase in the illumination intensity does not lead to a further voltage increase, meaning a small alternating light component (LED modulation) does not have any effect on the output voltage. An alternating current can form only in the characteristic curvature range. For that reason, the voltage at the opto-electronic element must be held to a value below the saturation voltage. The simplest way to do this is with a load resistor, which uses enough current so that the voltage at the opto-electronic element, for example, always amounts to half the saturation voltage. No external current is necessary for this, but the resistor must be adjusted constantly to the constant light or environmental light intensity. For example, for U/2 of the saturation voltage, an alternating light component will always cause a voltage change at the resistor as well.

DETAILED DESCRIPTION OF THE INVENTION

The invention is explained in more detail with an example and by referring to the enclosed drawings. However, the exemplary embodiments are simply examples, which are not designed to limit the inventive concept to a specific physical arrangement.

The circuit is designed to adjust the operating point of at least one opto-electronic element, wherein the opto-electronic element is a component of a receiver for alternating light useful signals with superimposed constant light signals. Known photodiodes 10, 10', 10", as well as light diodes 110 can function as an opto-electronic element. The essential quality of the opto-electronic element is that of being able to function as a receiver, which is on principle possible with a light-emitting diode. All circuits, however, have the problem that the opto-electronic elements can convert alternating light into useful output signals only within a specific range. It is therefore necessary to hold the operating point for these opto-electronic elements below the saturation voltage, which is done with a resistive circuit with automatic control resistance. In the resistive circuit, the resistance is controlled depending on the voltage and, if necessary, also depending on the frequency, so that a voltage develops constantly at the opto-electronic element, which is in the range of a preferably positive voltage below the saturation voltage.

Figure 6:
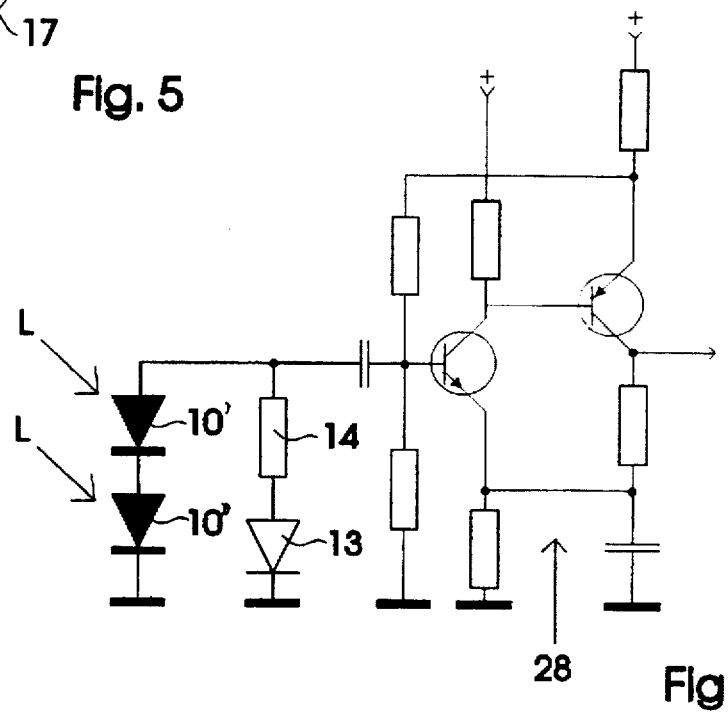
FIG. 6 is a circuit schematic according to FIG. 2 with an asymmetric amplifier circuit.
Figure 7:
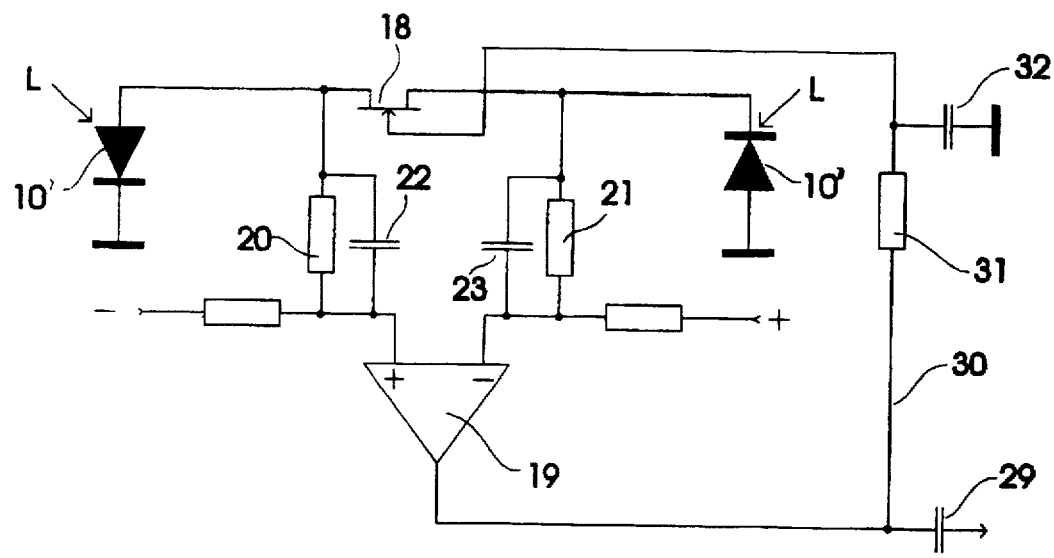
FIG. 7 is a circuit schematic showing a controllable field effect transistor, which can be controlled via an operational amplifier, connected between two photodiodes.
Figure 8:
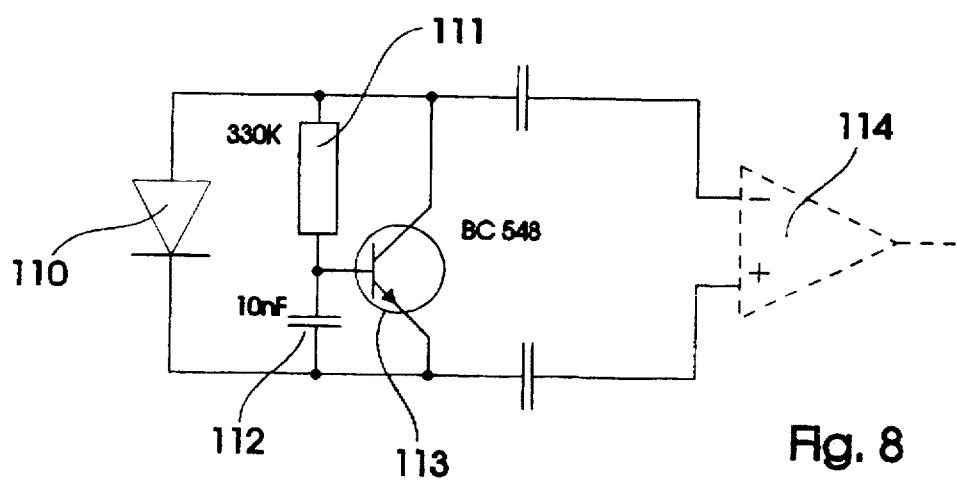
FIG. 8 is a circuit schematic having a light-emitting diode used as opto-electronic element.

Photodiodes 10, 10', 10" are used as opto-electronic elements in FIGS. 1 to 7, while a light-emitting diode 110 is used in FIG. 8.

Figure 1:
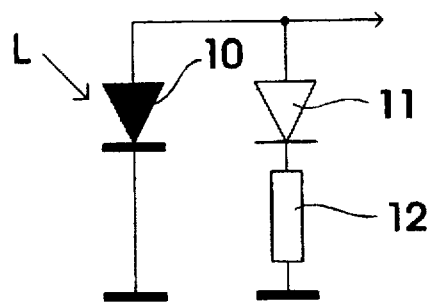
FIG. 1 is a circuit schematic showing a germanium diode with load resistor parallel-connected to a photodiode.

In FIG. 1, the photodiode 10 is subjected to an illumination L. A diode 11, which in this case is a germanium diode, is arranged parallel to the photodiode. Connected in series with the germanium diode 11 is a small load resistor 12 of about 10 kilohm. With increasing voltage of the photodiode 10, the germanium diode 11 opens up at about 0.3 V, so that the photodiode is loaded only if a photoelectric voltage >0.3 V appears. In that case, the excess voltage can then be discharged via the resistor 12, because the internal resistance of the germanium diode changes in dependence on the photoelectric voltage. The resistance functions to prevent signal asymmetries with high illumination densities (rectifier effects). The disadvantage of this circuit is that germanium diodes are currently rarely used, so that a relatively expensive circuit results in this case.

Figure 2:
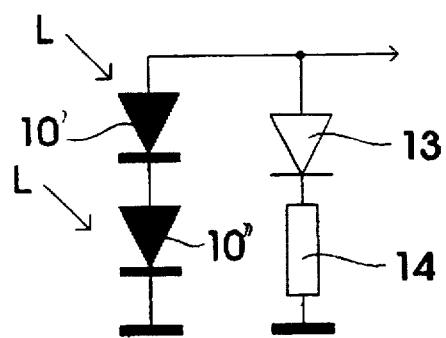
FIG. 2 is a circuit schematic showing two photodiodes, a Schottky or a silicon diode parallel-connected with a load resistor.

In FIG. 2, two photodiodes 10', 10" provide a combined positive and negative voltage of maximum 1 V when illuminated. A Schottky diode 13 (e.g. BAT 83) with a forward voltage of 0.4 V limits the photoelectric voltage to 0.2 V per photodiode.

The same result can be obtained by using a silicon diode (1N 41/48) with a forward voltage of about 0.6 V. In this case, twice the output voltage is an advantage while the use of two photodiodes is a disadvantage. As for the exemplary embodiment in FIG. 1, the Schottky diode 13 opens up when the forward voltage is reached, so that the resistor 14 of, for example, 2 kilohm can discharge the excess photoelectric voltage. It is also possible to omit the resistors 12, 14 in the exemplary embodiments shown in FIGS. 1 and 2, if the internal resistance of the diode 11 or the Schottky diode 13 is sufficiently high.

Figure 3:
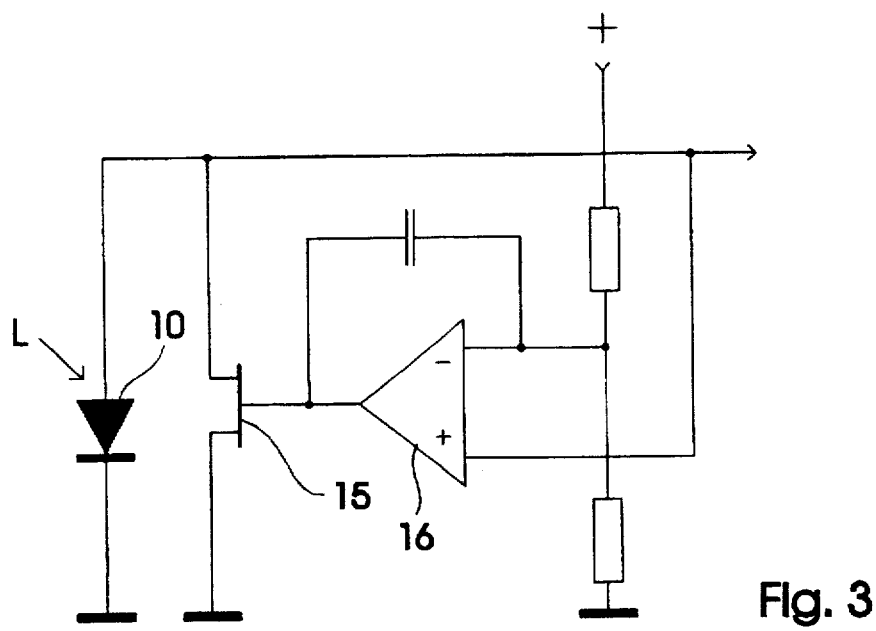
FIG. 3 is a circuit schematic showing a photodiode parallel connected with a field effect transistor.
Figure 4:
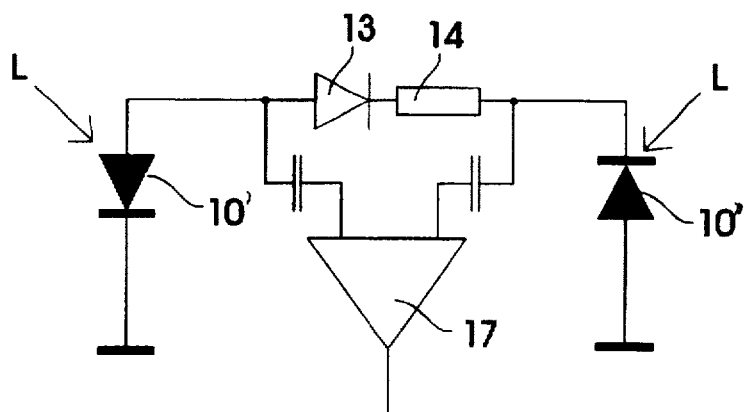
FIG. 4 is a circuit schematic according to FIG. 2 with a symmetric operational amplifier.
Figure 5:
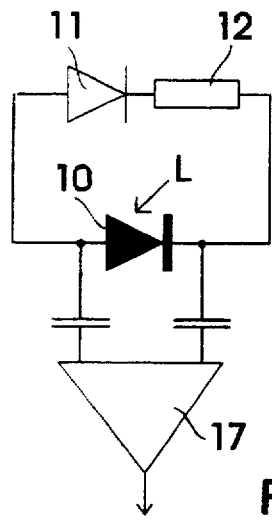
FIG. 5 is a circuit schematic according to FIG. 1 with a symmetric operational amplifier.

In the exemplary embodiment for FIG. 3, for example, a field effect transistor 15 is in parallel with or is added to the photodiode 10 that is subjected to an illumination L. The photodiode voltage is compared constantly to a reference voltage via an operational amplifier 16 and is adjusted by way of a field effect transistor. The field effect transistor functions as a variable resistor. In this case, the drain-source or the collector-emitter resistance is adjusted such that the voltage at the opto-electronic element remains below the saturation voltage or corresponds to about half the saturation voltage. The advantages of this circuit are that only one photodiode is required and that the control is also very exact. The disadvantage is that the operational amplifier requires current. However, since inertial operational amplifiers are preferably used in this case, the operational amplifier only requires a current of about 1.2 µA. Optional bipolar transistors or other semiconductor elements can be used in place of the field effect transistor 15. However, the latter require a low base current.

The circuits for FIGS. 1–3 can also be operated with a symmetric operational amplifier. This is shown for the exemplary embodiment of FIG. 2 in FIG. 4 and for the exemplary embodiment of FIG. 1 in FIG. 5. In both cases, the operational amplifier is added as a symmetric amplifier. Common-mode interferences are suppressed by this. The operational amplifier 17 is connected via capacitors parallel to germanium diode 11 or the Schottky diode 13 and corresponding resistors 12, 14. FIG. 6 shows a simplified version of the aforementioned circuits in that an asymmetric amplifier 28 is used.

An optimum, but somewhat more expensive solution is shown in FIG. 7. For photodiode current control, a field effect transistor 18 is arranged in series between two unipolar photodiodes 10', 10". An operational amplifier 19 is arranged parallel to the field effect transistor. Resistors 20, 21, which are bridged via capacitors 22, 23, are arranged between the photodiodes and the operational amplifier. The resistors only function to compensate the positive or negative photoelectric voltage to the operational amplifier, so that for a positive photoelectric voltage of, for example, 0.2 V and a negative photoelectric voltage of 0.2 V, the operational amplifier always has 0 plus 0 V. With this, the operational amplifier 19 can control the photodiode current via the field effect transistor 18. The capacitors 22, 23 function to bridge the alternating voltage, so that the operational amplifier 19 can additionally be used as first alternating light signal amplifier stage. The share of direct current is coupled out via capacitor 29, while the photodiode current is controlled via line 30. The alternating current is finally suppressed with components 31 and 32.

All circuits have in common that the photodiode is dynamically stressed, without current being drawn in considerable amounts from the power supply. Without illumination, the photodiode and, if existing, the load diodes or resistors are high-ohmic (or high-ohmic current sources). When subjected to illumination, the photodiode, as a generator, and the load diodes or resistors become low-ohmic, that is always in such a way that the internal resistance of the photodiodes is compensated for by an equally high internal resistance of the load diodes or resistors. (Exemplary embodiments of FIGS. 1, 2, 4, 5.) As a result of this, an output signal is always ensured, even if the external light share is high. Besides, the alternating light useful signal that must be detected to generate the output signal is for the most part low in relation to the constant light of the external illumination, regardless of which application range of the useful signal this concerns.

For one practical application, it has turned out that with a standard wiring and with full insolation, a current of 260 μA flows, which must be compensated with a countervoltage or current. The compensating current is in any case higher than is feasible with constant battery operation. For the mentioned exemplary embodiments (for which a downstream connected, low current operational amplifier takes over the task of control voltage generation for the field effect transistor and functions simultaneously as an alternating voltage amplifier), an average current consumption with high sensitivity and discrete amplifier in C-Mos Technology of 10 μA for the complete water sensor could be achieved. If we also include the high current for the rather seldom occurring alarm case, then a commercially available 9 V unit can last more than 2 years.

Light-emitting diodes can also be used as alternative for the photodiodes, but for the same purpose. In contrast to the known photodiodes, the light-emitting diodes have the advantage that they can on principle be acquired much cheaper. They supply between 0.9 V and 2 V as saturation voltage and can be stressed with a simple bipolar transistor 113, which is connected via a resistor 111 and a capacitor 112 preferably to a symmetric circuit. FIG. 8 shows that the transistor is connected parallel to the light-emitting diode 110. The transistor base point is connected between a resistor 111 of 330 kilohm and a capacitor 112 of 10 nF. The base collector path in this case is linked to the light-emitting diode 110, and the base emitter path with the off-state side of light-emitting diode 110. A BC 548 can be used as transistor. The operational amplifier 114 shown here with dashed line, for example, can be provided as an option since a symmetric wiring results in this case.

Alternatively, the same goal can also be reached with the photodiode path of a phototransistor, provided the base collector path is incorporated into the control circuit. However, this phototransistor path then functions again as a photodiode.

All the circuits have the advantage of not having any coils and thus can be easily integrated into an IC (integrated circuit). In addition, they can all be laid out so that they can be connected to a symmetric input. Even if more than one photodiode is needed as an opto-electronic element, as for the exemplary embodiment in FIG. 2, it is still not necessary to design these photodiodes differently at considerable expense since they can also receive uneven amounts of light without endangering the function of the circuit. The load control occurs exclusively for constant light signals, while alternating light signals are purposely suppressed during the load control. The opto-electronic elements used, photodiode 10, 10', 10" and light-emitting diode 110, as well as the base collector path for the phototransistor, represent opto-electronic elements that generate current during the short-circuit operation and voltage during the no-load operation. One essential difference between the light-emitting diode and the photodiode is that the light-emitting diode operates with high voltage and low current, while the photodiode operates with high current and low voltage.

It is understood that this description can be subject to various modifications, changes and adaptations, which are in the range of equivalents to the following claims.

I claim:

1. A circuit for adjusting an operating point of an opto-electronic element having a saturation voltage and which constitutes a component of a receiver for alternating light useful signals and which generates current during a short-circuit operation and voltage during a no-load operation, the circuit comprising:

a resistive circuit connected in parallel with the opto-electronic element for adjusting the operating point of the opto-electronic element below the saturation voltage for the compensation of constant light signals, the resistive circuit including an automatic control resistor which changes its resistance as a function of voltage when a specific voltage below the saturation voltage is exceeded for loading the opto-electronic element until the specific voltage is essentially reached.

2. The circuit according to claim 1, wherein the opto-electronic element comprises at least one photodiode that is loaded by the automatic control resistor.

3. The circuit according to claim 2, wherein the automatic control resistor comprises a diode parallel connected to the photodiode and having a threshold voltage corresponding to about half the saturation voltage for the photodiode.

4. The circuit according to claim 3, wherein the diode comprises a germanium diode.

5. The circuit according to claim 3, and further including a resistor connected in series with the diode.

6. The circuit according to claim 2, wherein the opto-electronic element comprises two photodiodes connected in series and the diode comprises one of a Schottky diode and a silicon diode parallel-connected to the two photodiodes, and the Schottky diode or the silicon diode has a threshold voltage that corresponds to about half the saturation voltage of the photodiodes.

7. The circuit according to claim 3, wherein the diode comprises one of a germanium diode, Schottky diode and a silicon diode connected in series with the resistor.

8. The circuit according to claim 2, wherein the automatic control resistor comprises one of a field effect transistor and bipolar transistor parallel-connected to the photodiode and an operational amplifier connected to the field effect transistor or bipolar transistor for controlling the resistance of the field effect transistor or bipolar transistor.

9. The circuit according to claim 2, further including a symmetric operational amplifier connected to the photodiode and the automatic control resistor.

10. The circuit according to claim 2, wherein the optoelectronic element comprises two unipolar photodiodes and the circuit further includes a field effect transistor arranged in series between the two unipolar photodiodes for controlling and an operation amplifier connected in parallel with the field effect transistor for controlling the field effect transistor, the operational amplifier having two inputs, each input of the operational amplifier having a series connected resistor to designed to compensate for photoelectric voltage.

11. The circuit according to claim 1, wherein the optoelectronic element comprises a light emitting diode.

12. The circuit according to claim 11, and further including a bipolar transistor parallel-connected to the light emitting diode as a load.

* * * * *